United States Patent
Pogu et al.

(10) Patent No.: US 7,360,645 B2
(45) Date of Patent: Apr. 22, 2008

(54) MODULAR-CONVEYOR-BELT-BASED APPARATUS AND METHOD FOR THE DISTRIBUTION OF COMPONENTS WHICH ARE DISPOSED IN STRIPS

(75) Inventors: Nicolas Pogu, Rocheserviere (FR); Roger Gris, La Guvonniere (FR); Gabriel Chataignier, Rocheserviere (FR)

(73) Assignee: Europlacer Industries, SAS, Rocheserviere (FR)

(*) Notice: Subject to any disclaimer, the term of this patent is extended or adjusted under 35 U.S.C. 154(b) by 25 days.

(21) Appl. No.: 10/578,503

(22) PCT Filed: Nov. 4, 2004

(86) PCT No.: PCT/FR2004/002843
§ 371 (c)(1),
(2), (4) Date: May 8, 2006

(87) PCT Pub. No.: WO2005/046303
PCT Pub. Date: May 19, 2005

(65) Prior Publication Data
US 2007/0080044 A1   Apr. 12, 2007

(30) Foreign Application Priority Data
Nov. 5, 2003 (FR) .................................. 03 12951
Oct. 16, 2004 (GB) .................................. 0423024.9

(51) Int. Cl.
*H05K 13/02* (2006.01)
(52) U.S. Cl. .................................................. 198/861.1
(58) Field of Classification Search ............... 198/583, 198/586, 833, 867.01, 867.15, 836.4, 861.1; 221/76
See application file for complete search history.

(56) References Cited

U.S. PATENT DOCUMENTS

| 3,596,752 | A  | * | 8/1971 | Garvey ..................... 198/831 |
| 4,371,075 | A  | * | 2/1983 | Erlichman ............... 198/345.3 |
| 4,475,642 | A  | * | 10/1984 | Fritz ....................... 198/345.3 |
| 4,676,359 | A  | * | 6/1987 | Swapp et al. .......... 198/370.07 |
| 5,271,139 | A  | * | 12/1993 | Sticht ......................... 29/430 |
| 6,281,478 | B2 | * | 8/2001 | Chandler et al. ........... 219/388 |
| 6,705,433 | B2 | * | 3/2004 | McQuaid et al. ............. 186/68 |
| 6,905,300 | B1 | * | 6/2005 | Russum ................. 414/331.14 |
| 6,955,119 | B2 | * | 10/2005 | Bobren et al. .................. 100/7 |

FOREIGN PATENT DOCUMENTS
DE  100 40 722  2/2002

* cited by examiner

Primary Examiner—Douglas A Hess
(74) Attorney, Agent, or Firm—James C. Lydon

(57) ABSTRACT

A system (1, 6) for the distribution of components which are disposed in strips (8), using conveyor belts (12) in order to transfer components (8) to a point at which they can be grabbed by the head of a pick-and-place machine. The system is equipped with one universal-base-forming portion (6) which preferably includes an integrated common motor (4) and an interface mechanism including a gearing system (3) which can drive the belts (12) of one or more independent, detachable distributor modules (1). The belts (12) are adapted to the width of the components and are releasably, but solidly connected to the universal base (6) in accordance with the production requirements of the device in terms of surface mounting.

6 Claims, 3 Drawing Sheets

MODULAR-CONVEYOR-BELT-BASED APPARATUS AND METHOD FOR THE DISTRIBUTION OF COMPONENTS WHICH ARE DISPOSED IN STRIPS

The present invention finds its application in the field of electronic component assembly and more particularly with pick and place machines used to mount electronic components such as integrated circuits (hereinafter referred to as "chips") or Surface Mounted Devices ("SMDs") on printed circuit boards. Moreover, it related to the distribution of such components (which are usually packaged in sticks, generally made of plastic or metal) and a device is used to feed these components, one at a time, to the head of the pick and place machine.

In order to distribute and present such electronic components, one at a time, to the head, several conventional systems and methods are used in the prior art. Components can be brought by gravity to the pick and place head, and this method requires an oblique/angled slope or canal that can interfere with the pick and place head. When the component supply canal has to be horizontally orientated, e.g. because of congestion problems, it is possible to feed components using vibrations. However, as the feeding of components is not positive, these machines are often slow. Furthermore, vibrations are sometimes difficult to optimise because of the mass variations when the component number is decreasing. In some instances, components are fed on a horizontal part of the machine by one or several belt distributors. The feeding is then more positive and the component transport is faster.

In the belt distributors referred to above, a first arrangement consists in integrating, on a base, a single wide belt on which are generally fed several components. The problem of this configuration is that components (such as chips) resting on the belt are standing on their leads, and because of the inevitable friction, there is a high risk of damaging or contaminating them. To prevent this problem, other devices consist of providing, on the same base, several belts, each being arranged to convey a certain type of component by its body, without touching its leads. The base is thus an autonomous system which includes belts, driving motors and command systems, and such a prior art system is shown in FIG. 1. The major disadvantage of these devices is that the base must be configured for one or several types of component of which the size is known in advance, making it difficult if not impossible to change the configuration (i.e. position/size) of the belts on the base in order to fit components of various sizes. Accordingly, every such conventional autonomous distribution device is dedicated to one or to a combination of component types. Meanwhile, the pick and place equipment should satisfy a need of flexibility that this kind of device cannot achieve. Furthermore, when a new type of component or a new combination of components is to be implemented, this type of equipment imposes the requirement to change the whole base, meaning additional time and expense.

According to a first aspect of the present invention, there is provided a distribution system for transfer of components to a position for picking by a pick and place machine head.

According to a second aspect of the present invention, there is provided a component distributor module for use in a distribution system for the transfer of components to a position for picking by a pick and place machine head.

According to a third aspect of the present invention, there is provided a base portion for use in a distribution system for the transfer of components to a position for picking by a pick and place machine head.

Preferably, the distribution system further comprises a control system and the base portion further comprises a second motive means to drive a common retractable bar which is typically provided with a spring means to assist return of the common retractable bar to a position closest to the components to be picked.

Typically, a plurality of individual component distributor modules are provided with each module having a belt means adapted to the width of a class of components.

Preferably, a single first motive means is provided for the base portion and which is adapted to drive each and every belt means of the respective plurality of component distributor modules via a transmission mechanism which typically ensures the synchronous rotation of the belt means for each of the distributor modules. The transmission mechanism preferably comprises a horizontally arranged geared member into which each of the component modules couples via respective geared means.

Embodiments of the present invention have the advantage that they allow fast loading and unloading of the modular component distributor modules on a universal common base portion, by means of an accurate location means at one side, and typically every component distributor module is typically at least partially provided with a notch and locating bar or the like at one side to permit an accurate location and is further typically at least partially provided with a fast fitting element.

Embodiments of the present invention will now be described, by way of example only, with reference to the accompanying drawings, in which.

Figure 1:
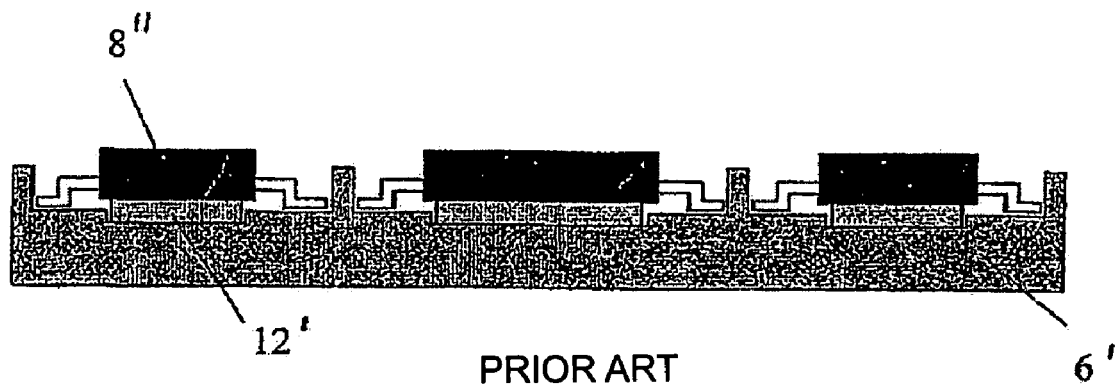
FIG. 1 is a schematic end view of a component belt transfer device according to the prior art.

FIG. 1 represents a device according to the prior art for transferring electronic components 8, such as chips 8''. The device of FIG. 1 comprises a base 6' which is an autonomous system which integrates belts 12', drive system (not shown) and the command system therefor (not shown). If another type of component 8 must be transported, it is necessary to change the base 6'.

Figure 2:
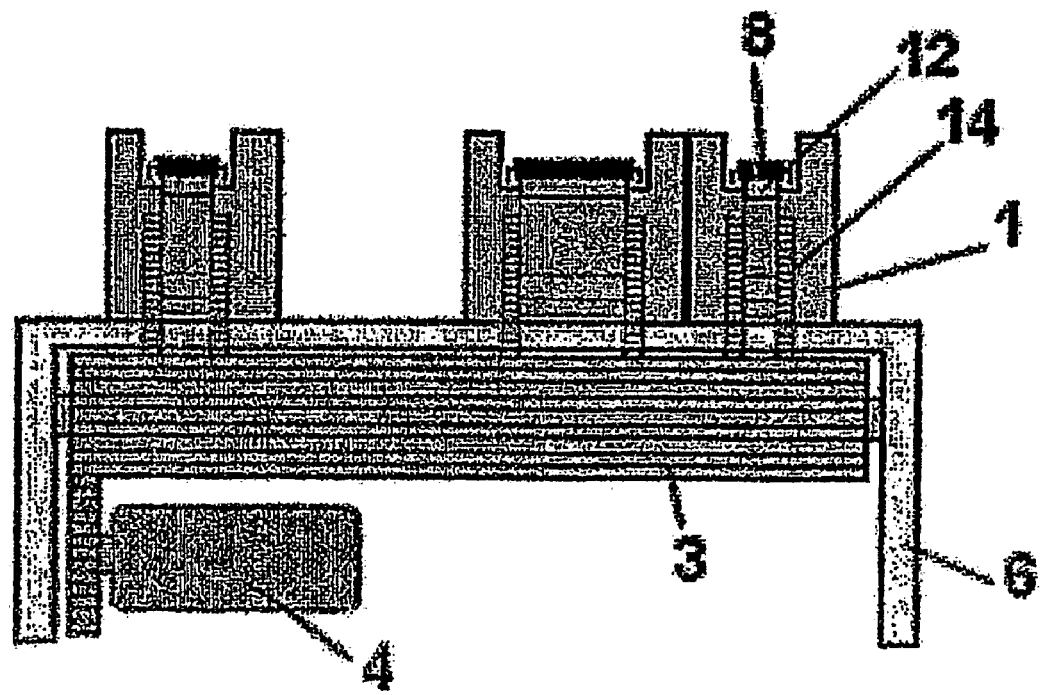
FIG. 2 is a schematic end view of an embodiment of a component distribution system according to the present invention.

FIG. 2 illustrates an end view of a system according to the present invention which includes a universal common base 6 and component 8 belt distribution modules 1 (also hereinafter referred to as "lane" 1). The distribution modules 1 are independent from one another and are detachable from the universal common base 6. A common motor 4 associated with the universal base 6 drives a common interface mechanism, which in FIG. 3 is depicted as a gear shaft 3 driving the belts 12 through geared wheels 14 arranged on each module 1.

Figure 3:
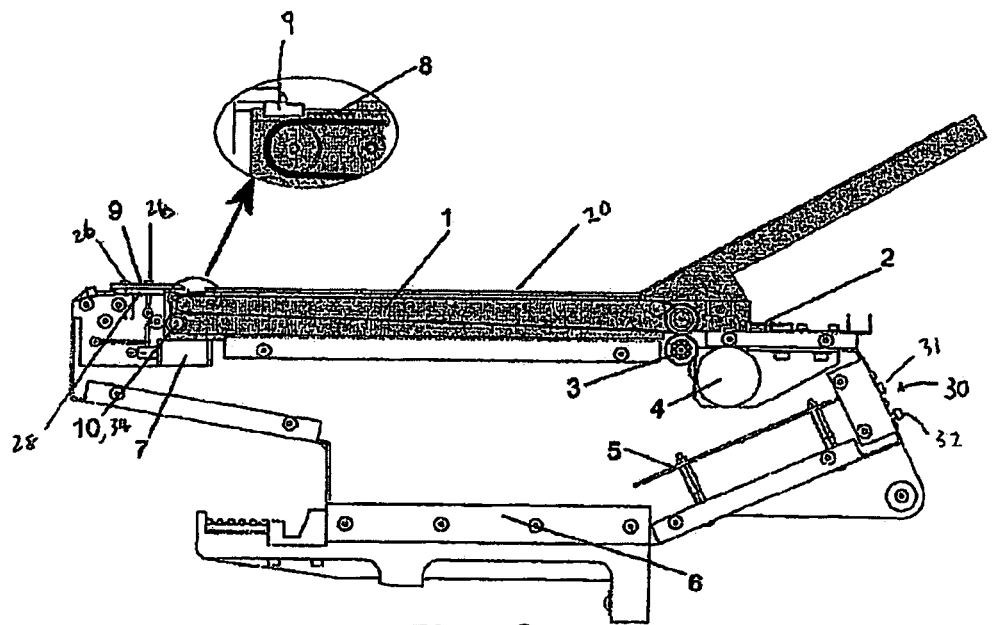
FIG. 3 is a side view of the component distribution system of FIG. 2 showing a universal base and an individual drive module.

FIG. 3 illustrates the embodiment of the present invention as comprising the universal base 6 and the individual distribution module 1. The aforementioned module 1 is detachable from the base 6 and moreover can be quickly secured to and detached from the base 6 by operation of releasable fixing means or fitment means, which are shown in FIG. 3 as being in the form of a notch which acts as a front stop 10 and a rear fitting clip 2.

A retractable stop 9 integrated into the common base 6 assists an individually fed component 8 to be picked up by the pick and place head (not shown) at the end of the transfer belt 12. This stop 9 is activated by an electromagnet 7 and it is adjustable according to the length of the component 8 in order to feed only one component 8 to the correct position to be picked up by the pick and place head. This stop 9 is retractable in order to avoid any pressure being exerted on the component 8 while the machine head (not shown) picks it up.

Figure 4:
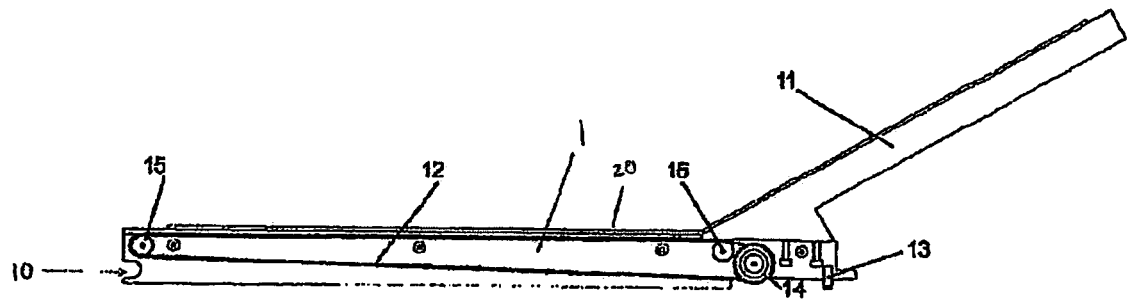
FIG. 4 is a side view of the individual drive module of FIG. 3.

FIG. 4 shows an individual distribution module 1 according to the invention. Every individual distribution module 1 is autonomous and includes a belt 12 for transporting components 8. This belt 12 is guided by bearings 15 having smooth outer circumferences. The belt 12 is driven by the geared wheel 14 which in turn is driven by the gear shaft 3 located on the universal base 6. The slope 11 is used as a component reservoir and as a stick guide. The location of the distribution module 1 on the universal base 6 is achieved by the notch or groove 10 located at the front of the distribution module 1 locating around a roller 34 provided on the universal base 6. The rear end of the distribution module 1 is then lowered onto the universal base 6 and a downwardly projecting pin 13 located at the back of the module 1 locates in a hole (not shown) provided in the upper surface of the universal common base 6.

The size of every individual distribution module 1, and more particularly, the width of the belt 12 for each individual distribution module 1, depends on the component 8 to be brought to the machine head. Accordingly, the width of the belt 12 for each individual distribution module 1 is chosen such that it is approximately equal to the width of the body of the components 8 such that when a component 8 is placed on the belt 8, it will lie on top of the belt 12 on its underside or belly, with the component's legs being situated laterally of the belt 12 such that the legs of the components 8 straddle and hang down from the belt 12.

The interaction between the components 8, 8' and the movement of the belt 12 and retractable stop 9 is shown in FIGS. 5 to 8.

Figure 5:
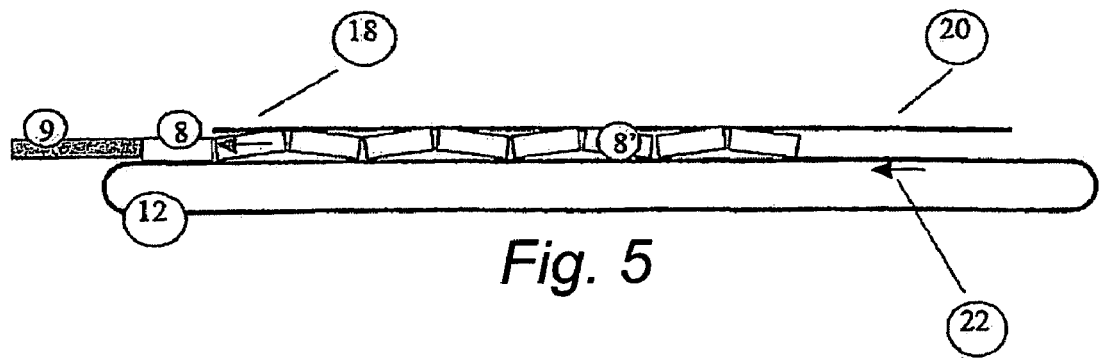
FIGS. 5 and 6 are schematic representations during the operation of picking a component from an individual detachable module of FIG. 3.

The components 8 are initially contained in a stack within a tube (not shown) which is placed on the angled slope 11 in the correct orientation so that the components 8 are fed onto the slope 11 end of the belt 12 in the correct orientation. The components 8 are thus sitting on top of the belt 12 with their legs straddling the belt 12 and when the belt moves in the direction of arrow 22 in FIG. 5 (the upper portion of the belt moving from right to left toward the picking location in FIG. 5), the components 8' pass underneath upper guide path 20. FIG. 5 is a schematic diagram showing one belt 12 after the components 8, 8' have been pushed right to left by the belt 12. The friction created between the belt 12 and the components 8, 8' generates a log jam or a compression between the components 8, 8', and as shown in FIG. 5, the components 8, 8' will tend to fill the gap between the upper surface of the belt 12 and lower surface of the upper guide path 20, since the retractable stop 9 as shown in FIG. 5 is preventing any further right to left travel in the direction of arrow 22 of the left hand most component 8. Accordingly, the force acting upon component 8 in FIG. 5 by the following components 8' is shown as arrow 18. Accordingly, if a pick and place head were to try and pick the component 8 up by means of a conventional vacuum nozzle suction action, if the force 18 is too high, the picking action may fail since the component 8 is effectively locked in position between the retractable stop 9 and the following components 8'.

Figure 6:
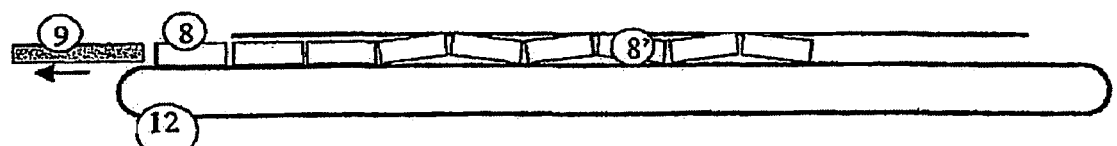

To avoid the potential failure of the picking action, the belt 12 is stopped momentarily and the stop 9 is retracted or moved from right to left as shown in FIG. 6, and in so doing, creates a gap between it 9 and the component 8 to be picked which therefore releases the pressure on the component 8.

As can be seen in FIG. 6, the upper guide path 20 is arranged to only extend as far as the left hand most component 8', such that the upper guide path 20 will not interfere in the picking action of the component 8. Accordingly, the pick and place head can now be moved into position above the component 8 and when its suction action is activated, can pick the component 8 in an upwards direction.

If only one individual detachable distribution module 1 is in use, the components 8' sitting on that belt 12 can then be advanced from right to left to the position shown in FIG. 5 and the above noted steps set out for FIGS. 5 and 6 can then be repeated.

Figure 7:
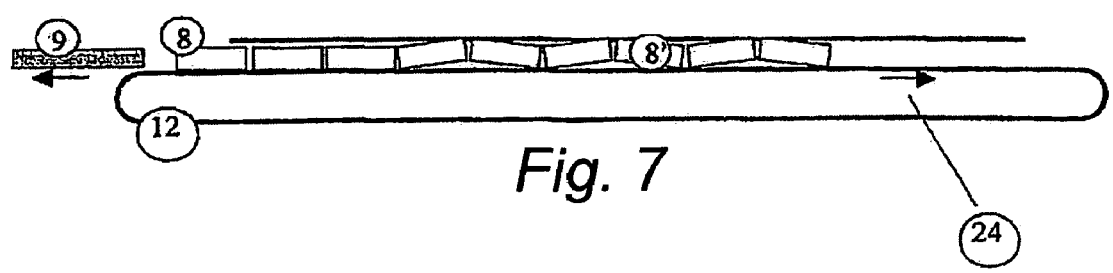
FIGS. 7 and 8 are schematic representations of an individual detachable module which has not had a component picked from it.
Figure 8:
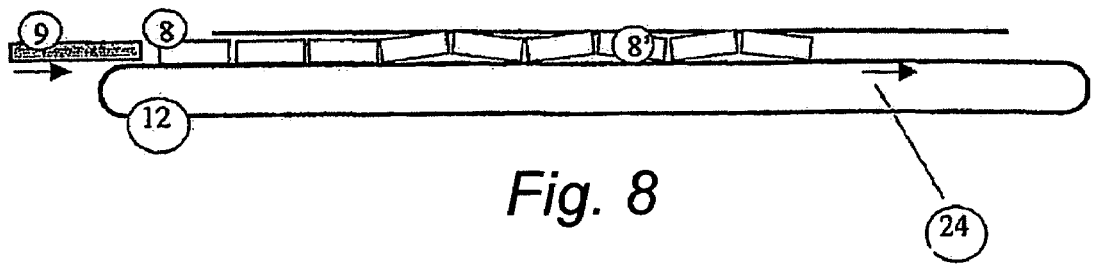

However, where more than one individual detachable distribution module 1 is located on the universal common base 6, as shown in FIG. 2, further steps set out below in FIGS. 7 and 8 are desirable. FIGS. 7 and 8 show non-used lanes and as the reader will appreciate, all of the belts 12 of all of the individual detachable distribution modules 1 are moved simultaneously due to the common motor 4. Accordingly, in FIG. 7, the component 8 has not been picked. However, at this point it is desirable to reverse the belt 12, that is from left to right as shown by arrow 24 in FIG. 7. The reason for this reverse movement of the belt 12 is because all of the retractable stops 9 of all of the individual detachable distribution modules 1 are coupled to the single electromagnet 7. Therefore, if the retractable stop 9 were moved back to the position shown in FIG. 5 in a lane 1 where the component 8 had not been picked (as for example in FIG. 7) there is a risk that the retractable stop 9 will hit or collide with the unpicked component 8 with the risk of it jumping off the belt 12. Accordingly, for this reason, the belt 12 is driven backwards (i.e. in the direction of arrow 24 in FIGS. 7 and 8) to move the unpicked component 8 further away from the retractable stop 9, typically by about 1 to 2 mm.

The retractable stop 9 is then moved in the direction of the arrow shown in FIG. 8 (i.e. from left to right) toward the unpicked component 8, but without any risk of immediately touching the unpicked component 8.

The detachable distribution modules 1 are then ready for a new cycle of steps starting from FIG. 5 and thus all the belts 12 can be moved again in the direction of arrow 22. Of course, the unpicked components 8 on the non-used lanes of FIGS. 7 and 8 will arrive very quickly at the stop 9. However, because the body of conventional chips or surface mounted devices (SMD's) 8 can slip on the belt 12, the configuration of the components 8' in FIG. 6 does not stop or otherwise jam the belt 12. Accordingly, the substantial lack of friction between the underside or belly of the components 8 and the belt 12 reiterates the importance that the fragile leads of the components 8 must not lay on the belts 12.

It should be noted that the individual retractable stops 9 are mounted on a common bar 28 on the universal common base 6, wherein the individual retractable stops 9 can be individually configured by individually moving them either closer to their respective detachable distribution modules 1 or further away from their respective detachable distribution modules 1 by means of tightening/loosening fastening means 26 such as screws or the like, such that the retractable stops 9 for each of the individual detachable distribution modules 1 can be adjusted depending upon the exact length of the component 8 requiring to be picked.

A control module 30 is provided at the front or user end of the universal common base 6 which includes a microprocessor on an electronic board (not shown), the internal memory of which provides the possibility to "instruct" the individual detachable distribution modules 1 as to the nature and reference of the components 8, 8' being supplied to it. Furthermore, the microprocessor in the control module 30 can count the number of components 8, 8' to be picked and the internal memory of which can be uploaded by connecting it to a micro terminal which is able to read barcodes attached to the side of the tube or stick of components 8, 8'Furthermore, the control module 30 is connected to the pick and place machine by means of an electrical bus (not shown) and information can be exchanged between the control module 30 and the pick and place machine in both directions. As seen in FIG. 2, the individual distribution modules 1 can be placed at any location along the width of the universal common base 6 and a transmitter on the individual detachable distribution modules 1 can be detected by a receiver connected to the pick and place head of the pick and place machine in order to provide the location of the individual detachable distribution module 1 across the width of the universal common base 6. Furthermore, if a lane or individual detachable distribution module 1 has run out of components 8 or if the picking of a component has failed several times, an LED is lit on the front panel 31 of the control module 30. Furthermore, a button 32 is provided on each front panel 31 of the control module for each lane 1 where the button 32 is wired into the control module 30 such that after a lane 1 has been filled with components, the operator can press the button to re-activate the lane 1 and switch off the lit LED.

It should be noted that the components 8 do not need to be supplied to the angled slope 11 in plastic tubes or the like but could be supplied directly onto the belt 12 or the angled slope 11 by means of reeled tapes (not shown) of components 8 or the like.

Accordingly, embodiments of the present invention provide the advantage that they overcome the apparently contradictory objectives of lesser capital cost and greater flexibility. Conventionally, when the goal has been to introduce some flexibility into production systems, the capital cost increases. Alternatively, when the goal has been to decrease the capital cost of investment it is to the detriment of the flexibility of production. In contrast, embodiments of the present invention provide the advantage in dissociating the functions and in handling in a different way the common functions and the specific functions. In this way, the common functions will only require to be invested once in terms of the universal common base 6 and the specific functions can be used in a flexible way in terms of the individual distribution modules 1. Furthermore, embodiments of the present invention provide the advantage that they may be easily configurable according to the production requirements.

Modifications and improvements may be made to the embodiments hereinbefore described without departing from the scope of the invention.

The invention claimed is:

1. A distribution system for transfer of components to a position for picking by a pick and place machine head, the distribution system comprising:
   at least one component distributor module comprising a belt member adapted to the width of the component to be transferred; and a base portion comprising a motive means adapted to drive a belt member of the at least one component distributor module;
   wherein the at least one component distributor module is adapted to be releasably fixed to the base portion, and
   wherein the distribution system is provided with a retractable member, provided on the base portion and driven by a second motive means provided on the base portion, for transferring the component by the belt to a location in which the component is held from further movement until the component is picked by the pick and place head.

2. The distribution system of claim 1, further comprising releasable fixing means arranged to act between the base portion and the at least one component distributor module.

3. The distribution system of claim 2, wherein the releasable fixing means comprises a male member provided on one of the base portion and the at least one component distributor module, and a female member provided on the other of the base portion and the at least one component distributor module, and a releasable locking member arranged to prevent the male and female members from disengaging from one another when locked, and further arranged to permit the female and male members to engage/disengage one another when unlocked.

4. The distribution system of claim 3, wherein the male and female member are provided at one side of the said one of the base portion and the at least one component distributor module, and the releasable locking member is provided at the other side of the said one of the base portion and the at least one component distributor module.

5. The distribution system of claim 3, wherein the male member comprises a protruding member and the female member comprises a groove, the protruding member and groove arranged to provide a close fit with one another.

6. The distribution system of claim 3, wherein the releasable locking member comprises a clip means provided on one of the base portion and the at least one component distributor module, wherein the clip means can be releasably secured to the said one whilst securely trapping a portion of the other of the base portion and the component distributor module.

* * * * *